United States Patent
Ono et al.

(10) Patent No.: US 8,368,129 B2
(45) Date of Patent: Feb. 5, 2013

(54) ILLUMINATION DEVICE AND METHOD FOR MANUFACTURING SAME

(75) Inventors: Tomio Ono, Kanagawa-ken (JP);
Shintaro Enomoto, Kanagawa-ken (JP);
Yasushi Shinjiyo, Kanagawa-ken (JP);
Taeko Urano, Kanagawa-ken (JP); Akio Amano, Kanagawa-ken (JP); Keiji Sugi, Kanagawa-ken (JP); Tomoaki Sawabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 12/875,548

(22) Filed: Sep. 3, 2010

(65) Prior Publication Data
US 2011/0215362 A1 Sep. 8, 2011

(30) Foreign Application Priority Data
Mar. 2, 2010 (JP) ................................. 2010-045705

(51) Int. Cl.
*H01J 63/04* (2006.01)
(52) U.S. Cl. .................. 257/291; 257/E51.019; 313/505
(58) Field of Classification Search .......................... None
See application file for complete search history.

(56) References Cited

U.S. PATENT DOCUMENTS

| | | | | |
|---|---|---|---|---|
| 6,693,296 B1 * | 2/2004 | Tyan | ............. | 257/40 |
| 7,423,374 B2 * | 9/2008 | Okano | ............. | 313/509 |
| 7,589,462 B2 * | 9/2009 | Kim et al. | ............. | 313/504 |
| 2005/0122043 A1 * | 6/2005 | Kato et al. | ............. | 313/512 |
| 2005/0127372 A1 * | 6/2005 | Ishihara et al. | ............. | 257/72 |
| 2010/0102335 A1 * | 4/2010 | Takagi et al. | ............. | 257/88 |

FOREIGN PATENT DOCUMENTS

| | | |
|---|---|---|
| JP | 2000-36391 | 2/2000 |
| JP | 2005-158371 | 6/2005 |
| JP | 2010-45048 | 2/2010 |
| JP | 2011-29022 | 2/2011 |

OTHER PUBLICATIONS

Japanese Office Action issued Dec. 21, 2011, in Patent Application No. 2010-045705 (with English-language translation).
U.S. Appl. No. 13/413,027, filed Mar. 6, 2012, Sawabe et al.
U.S. Appl. No. 12/872,281, filed Aug. 31, 2010, Yonehara, et al.

* cited by examiner

*Primary Examiner* — Benjamin Sandvik
(74) *Attorney, Agent, or Firm* — Oblon, Spivak, McClelland, Maier & Neustadt, L.L.P.

(57) ABSTRACT

According to one embodiment, an illumination device includes an anode, a metal layer, a cathode, an organic electroluminescent unit, first and second insulating layers, and a plurality of conductive piercing layers. The metal layer has an electrical resistance lower than that of the anode. The cathode is provided between the anode and the metal layer. The organic electroluminescent unit is provided between the anode and the cathode. The first insulating layer is provided between the cathode and the metal layer. The conductive piercing layers pierce the organic electroluminescent unit, the cathode, and the first insulating layer along a direction from the anode toward the metal layer to electrically connect the anode to the metal layer, and are separate entities from the metal layer. The second insulating layer is provided between the organic electroluminescent unit and the conductive piercing layers and between the cathode and the conductive piercing layers.

12 Claims, 9 Drawing Sheets

ILLUMINATION DEVICE AND METHOD FOR MANUFACTURING SAME

CROSS-REFERENCE TO RELATED APPLICATIONS

This application is based upon and claims the benefit of priority from the prior Japanese Patent Application No. 2010-045705, filed on Mar. 2, 2010; the entire contents of which are incorporated herein by reference.

FIELD

Embodiments described herein relate generally to an illumination device and a method for manufacturing the same.

BACKGROUND

Organic electroluminescent elements are drawing attention in applications such as planar light sources. In an organic electroluminescent element, an organic thin film is provided between a cathode and an anode; a voltage is applied between the cathode and the anode; excitons are created; and the light emitted when the excitons undergo radiative deactivation is utilized. Materials having relatively low conductivities such as, for example, ITO (Indium Tin Oxide) are used as the anode.

In organic electroluminescent elements having large surface areas, the contact portions for applying a voltage to the element often are provided at the periphery of the light emitting unit. Therefore, the voltage applied to the element decreases and the luminance decreases at the light emitting unit distal to the contact portion mainly due to a potential drop caused by the resistance of the anode; and the brightness becomes nonuniform.

Conversely, it is conceivable to employ a measure that adds, for example, a metal supplemental interconnect having a mesh configuration on the anode. However, in such a case, the opening ratio decreases and the luminance decreases.

On the other hand, JP-A 2005-158371 (Kokai) discusses an organic EL element having a configuration in which an anode, an organic layer, and a cathode are stacked sequentially on a transparent substrate; this stacked structural body is covered with a sealing film; an anode terminal is provided on the sealing film; an opening is provided in the sealing film; the cathode is exposed at the opening and a cathode terminal is formed; multiple through-holes are provided to pierce the sealing film, the cathode, and the organic layer in portions where the opening of the sealing film is not provided; and an anode terminal is electrically connected to the anode via the through-holes.

Using such conventional art, the potential drop of the anode cannot be suppressed sufficiently; and there is room for improvement to realize a uniform and bright illumination device having a large surface area with high productivity.

DETAILED DESCRIPTION

Figure 1A:
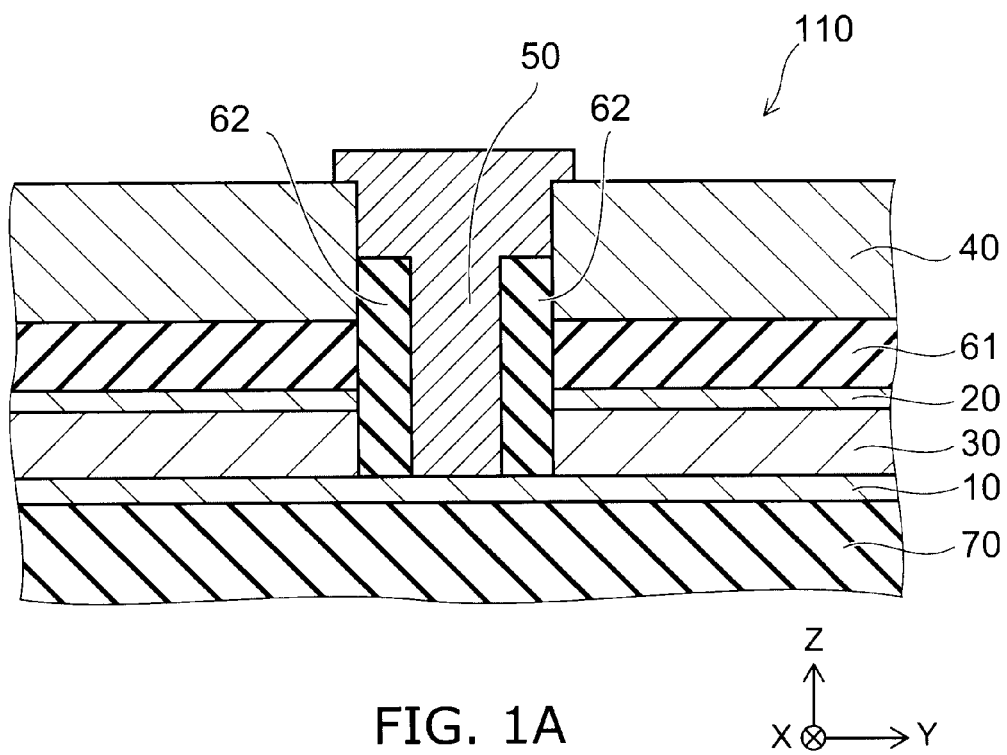
FIG. 1A and FIG. 1B are schematic views illustrating the configuration of an illumination device according to a first embodiment.

In general, according to one embodiment, an illumination device includes an anode, a metal layer, a cathode, an organic electroluminescent unit, a first insulating layer, a plurality of conductive piercing layers, and a second insulating layer. The metal layer has an electrical resistance lower than an electrical resistance of the anode. The cathode is provided between the anode and the metal layer. The organic electroluminescent unit is provided between the anode and the cathode. The first insulating layer is provided between the cathode and the metal layer. The plurality of conductive piercing layers pierces the organic electroluminescent unit, the cathode, and the first insulating layer along a direction from the anode toward the metal layer to electrically connect the anode to the metal layer. The plurality of conductive piercing layers is separate entities from the metal layer. The second insulating layer is provided between the organic electroluminescent unit and each of the plurality of conductive piercing layers and between the cathode and each of the plurality of conductive piercing layers.

According to another embodiment, a method is disclosed for manufacturing an illumination device. The method can form an anode, an organic electroluminescent unit, and a cathode on a substrate in the order of the anode, the organic electroluminescent unit, and the cathode. The method can place a metal layer having a plurality of first holes on the cathode via a first insulating layer. The method can make a plurality of second holes to pierce the organic electroluminescent unit, the cathode, and the first insulating layer by using the plurality of first holes as a mask. The method can fill an insulating material into the plurality of second holes. The method can make a third hole in the insulating material to reach the anode. In addition, the method can electrically connect the metal layer to the anode by filling a conductive material into the third hole.

According to yet another embodiment, a method is disclosed for manufacturing an illumination device. The method can form an anode, an organic electroluminescent unit, and a cathode on a substrate in the order of the anode, the organic electroluminescent unit, and the cathode. The method can make a plurality of fourth holes to pierce the organic electroluminescent unit and the cathode. In addition, the method can fit a plurality of conductive protrusions formed on a major surface of a metal layer into the fourth holes and fix the metal layer to the cathode via an insulating layer formed on the major surface of the metal layer. The fixing is performed in a state in which the insulating layer opposes the cathode and the anode is electrically connected to the plurality of protrusions and the metal layer.

Exemplary embodiments of the invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings of the application, components similar to those described in regard to a drawing thereinabove are marked with like reference numerals, and a detailed description is omitted as appropriate.

First Embodiment

Figure 1B:
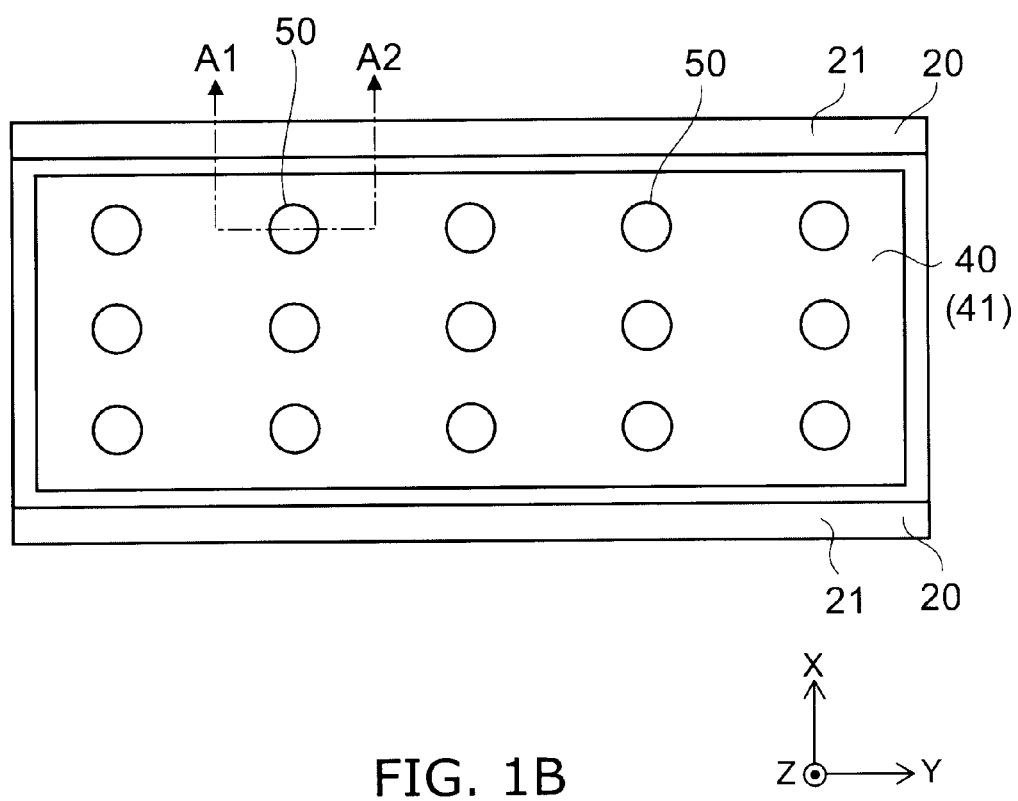

FIG. 1A and FIG. 1B are schematic views illustrating the configuration of an illumination device according to a first embodiment of the invention.

Namely, FIG. 1B is a schematic plan view; and FIG. 1A is a cross-sectional view along line A1-A2 of FIG. 1B.

As illustrated in FIG. 1A and FIG. 1B, the illumination device 110 according to this embodiment includes an anode 10, a cathode 20, and an organic electroluminescent unit 30 provided between the anode 10 and the cathode 20. In other words, the illumination device 110 is an illumination device using an organic electroluminescent material.

The illumination device 110 further includes a metal layer electrically connected to the anode 10. Thereby, a nonuniform brightness caused by potential fluctuation due to the resistance of the anode 10 can be suppressed even in the case where the illumination device 110 has a large surface area.

In other words, the illumination device 110 includes: the anode 10; the metal layer 40 having a lower electrical resistance than that of the anode 10; the cathode 20 provided between the anode 10 and the metal layer 40; the organic electroluminescent unit 30 provided between the anode 10 and the cathode 20; a first insulating layer 61 provided between the cathode 20 and the metal layer 40; multiple conductive piercing layers 50 piercing the organic electroluminescent unit 30, the cathode 20, and the first insulating layer 61 along a direction (the stacking direction) from the anode 10 toward the metal layer 40; and a second insulating layer 62 provided between the organic electroluminescent unit 30 and each of the multiple conductive piercing layers 50 and between the cathode 20 and each of the multiple conductive piercing layers 50.

Herein, the direction (the stacking direction) from the anode 10 toward the metal layer 40 is taken as a Z axis direction. One direction perpendicular to the Z axis direction is taken as an X axis direction. A direction perpendicular to the Z axis direction and the X axis direction is taken as a Y axis direction. Herein, the configuration (the planar configuration as viewed from the Z axis direction) of the illumination device 110 is a rectangle aligned in the X axis direction and the Y axis direction. However, this embodiment is not limited thereto. The configuration of the illumination device 110 is arbitrary.

The multiple conductive piercing layers 50 are electrically connected to the anode 10 and the metal layer 40. The multiple conductive piercing layers 50 are separate entities from the metal layer 40. Also, the multiple conductive piercing layers 50 are separate entities from the anode 10.

In this specific example, a substrate 70 is provided on the side of the anode 10 opposite to the organic electroluminescent unit 30. It is sufficient for the substrate 70 to be provided as necessary; and it is possible to omit the substrate 70 in some cases. A glass substrate, for example, may be used as the substrate 70.

The organic electroluminescent unit 30 includes an organic electroluminescent layer. The organic electroluminescent layer may include, for example, Alq3 (tris(8-hydroxyquinolinato)aluminum), and the like. However, this embodiment is not limited thereto. The organic electroluminescent layer may include any material. In addition to the organic electroluminescent layer, the organic electroluminescent unit 30 may further include various organic films such as charge transport organic films and charge injection layers.

The anode 10 may include, for example, ITO. As described below, it is desirable for the anode 10 to be highly transparent to transmit light emitted by the organic electroluminescent unit 30. Therefore, the thickness of the anode 10 may be, for example, about 0.15 μm. In other words, importance is attached to the light extraction efficiency of the anode 10; and the conductivity is relatively low, that is, the electrical resistance is relatively high.

On the other hand, the cathode 20 may include, for example, aluminum (Al), etc.

However, this embodiment is not limited thereto. The anode 10 and the cathode 20 may include any material suited to cause the organic electroluminescent unit 30 to emit light.

In the illumination device 110, the portion of the cathode 20 not covered with the other members forms a cathode side contact 21. The metal layer 40 forms an anode side contact 41. The anode side contact 41 may be at any location of the metal layer 40.

In the illumination device 110, a voltage is applied to the organic electroluminescent unit 30 provided between the anode 10 and the cathode 20 by applying a voltage between the metal layer 40 (the anode side contact 41) electrically connected to the anode 10 and the cathode 20 (the cathode side contact 21). Thereby, electrons are injected into the organic electroluminescent unit 30 from the cathode 20; and holes are injected into the organic electroluminescent unit 30 from the anode 10. The electrons and the holes recombine in the organic electroluminescent unit 30; excitons are created; and the light emitted when the excitons undergo radiative deactivation is utilized.

The light emitted by the organic electroluminescent unit 30 passes through the transparent anode 10, and in this case, also passes through the substrate 70 to be emitted to the external environment of the illumination device 110. In other words, a portion of the emitted light passes through the anode 10 as-is; and another portion of the emitted light passes through the anode 10 after being reflected by the cathode 20 to be emitted to the external environment.

The metal layer 40 may include a metal such as Al, Cu, etc. The thickness (the thickness along the stacking direction) of the metal layer 40 is, for example, not less than 10 micrometers (μm). Specifically, the thickness of the metal layer 40 is not less than 100 μm, e.g., about 500 μm. Thus, the metal layer 40 may include metal having a plane-like shape in which the thickness is smaller than the length and the width by using a highly conductive metal such as a metal film, a metal sheet, a metal foil, a metal plate, etc.

The metal layer 40 may have a planar configuration or a curved configuration. In the case where the metal layer 40 has a curved configuration, the anode 10, the organic electroluminescent unit 30, and the cathode 20 have curved configurations conforming to the curved surface of the metal layer 40. In the case where the substrate 70 is provided, the substrate 70 has a configuration conforming to the metal layer 40.

The first insulating layer 61 has a function of insulating the cathode 20 from the metal layer 40. The first insulating layer 61 may include, for example, resin and the like. The first insulating layer 61 also may have the function of bonding and fixing the cathode 20 to the metal layer 40.

The second insulating layer 62 insulates the conductive piercing layer 50 from the cathode 20 and insulates the conductive piercing layer 50 from the organic electroluminescent unit 30. It is sufficient for the second insulating layer 62 to be provided between the organic electroluminescent unit 30 and each of the multiple conductive piercing layers 50 and between the cathode 20 and each of the multiple conductive piercing layers 50. The second insulating layer 62 may be further provided, for example, between the first insulating layer 61 and the multiple conductive piercing layers 50. A portion of the second insulating layer 62 may extend to a portion between the metal layer 40 and the multiple conductive piercing layers 50. However, in such a case as well, the electrical connection between the metal layer 40 and the multiple conductive piercing layers 50 is maintained.

The second insulating layer 62 may include, for example, a photosensitive resin. Thereby, as described below, the illumination device 110 can be manufactured with high productivity. However, this embodiment is not limited thereto. The second insulating layer 62 may include any material that insulates the conductive piercing layer 50 from the cathode 20 and insulates the conductive piercing layer 50 from the organic electroluminescent unit 30.

Each of the multiple conductive piercing layers 50 electrically connects the metal layer 40 to the anode 10. Each of the multiple conductive piercing layers 50 may include, for example, a conductive resin. In other words, the conductive piercing layer 50 is provided as a separate entity from the metal layer 40. For example, the conductive piercing layer 50 may include a material having better patternability than, for example, the metal layer 40. Thereby, as described below, the illumination device 110 can be manufactured with high productivity.

The metal layer 40 has a conductivity higher than that of the anode 10 and has a function of suppressing the potential drop of the anode 10 caused by the resistance of the anode 10. In other words, the metal layer 40 is electrically connected to the anode 10 by the multiple conductive piercing layers 50; and thereby, the drop of the potential of the anode 10 is suppressed; and the potential of the anode 10 is substantially constant in the plane of the anode 10. Thereby, a uniform and bright illumination device can be realized.

Further, a thick metal layer 40 is used in the illumination device 110 according to this embodiment. Therefore, a uniform planar distribution of the temperature can be provided in the illumination device.

In other words, in the case where a temperature distribution occurs along an inner-plane direction in an illumination device having a large surface area, the luminance may become nonuniform according to the temperature characteristics of the organic electroluminescent unit 30. Conversely, in the illumination device 110 according to this embodiment, the thick metal layer 40 improves the thermal uniformity and reduces the temperature distribution. Thereby, the fluctuation of the brightness caused by the temperature distribution can be suppressed.

Thus, in the illumination device 110, not only the nonuniform brightness caused by the potential drop of the anode 10 but also the nonuniform brightness caused by the nonuniform temperature can be suppressed simultaneously.

First Comparative Example

An illumination device of a first comparative example has a configuration in which a metal supplemental interconnect having a mesh configuration is formed on the anode and covered with an insulating layer to suppress the potential drop of the anode. In such a case, the width of the metal supplemental interconnect is set to be not less than a constant to reduce the electrical resistance of the metal supplemental interconnect. In such a first comparative example, light is not emitted from the portion corresponding to the metal supplemental interconnect and light is screened. Therefore, the opening ratio, i.e., the ratio of the light emission surface area to the element surface area, is, for example, 80% to 90%. In such a case, light is not emitted from the contact portions as well. This also causes the opening ratio to decrease further.

On the other hand, in the illumination device 110 according to this embodiment, a metal supplemental interconnect having a mesh configuration such as that recited above is not provided; and the metal layer 40, which is a conductor over the entire surface, is used. Because the metal layer 40 is provided on the cathode 20 side of the organic electroluminescent unit 30, the metal layer 40 does not screen the light emission. Although light is not emitted from the portions of the multiply provided conductive piercing layers 50 in the illumination device 110, the surface area of the multiple conductive piercing layers 50 (the surface area when the conductive piercing layers 50 are cut by a plane orthogonal to the stacking direction) is sufficiently small compared to the surface area of the organic electroluminescent unit 30. Therefore, the decrease of the opening ratio is substantially not a problem. Thus, compared to the first comparative example, the opening ratio of the illumination device 110 does not decrease and bright, uniform light can be produced.

Second Comparative Example

Figure 2:
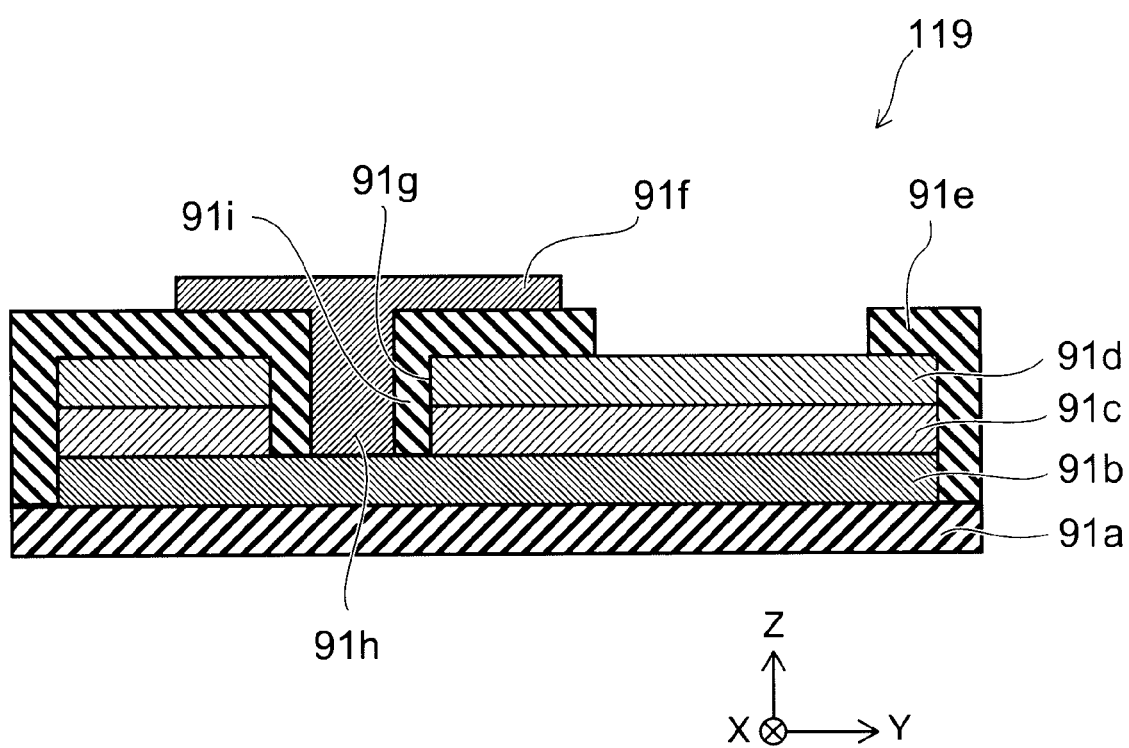
FIG. 2 is a schematic view illustrating the configuration of an illumination device of a second comparative example.

FIG. 2 is a schematic view illustrating the configuration of an illumination device of a second comparative example.

As illustrated in FIG. 2, the illumination device 119 of the second comparative example is an organic electroluminescent element in which a first electrode 91b (the anode), an organic layer 91c including a light emitting layer, and a second electrode 91d (the cathode) are stacked in this order on a substrate 91a. A portion of the second electrode 91d is covered with a sealing member 91e; and the portion of the second electrode 91d not covered with the sealing member 91e functions as a second terminal. A first terminal 91f is provided on the side of the sealing member 91e opposite to the second electrode 91d. The first electrode 91b is connected to the first terminal 91f by a through-hole 91g piercing the sealing member 91e, the second electrode 91d, and the organic layer 91c. A power source is connected to the first electrode 91b and the second electrode 91d. A conductive unit 91h electrically connecting the first electrode 91b to the first terminal 91f is provided in a portion of the through-hole 91g; and an insulating unit 91i insulating the conductive unit 91h from the organic layer 91c and the conductive unit 91h from the second electrode 91d is provided in a portion of the through-hole 91g.

In the illumination device 119 of the second comparative example having such a configuration, the conductive unit 91h is formed integrally with the first terminal 91f. For example, the conductive unit 91h is formed by vapor deposition of aluminum to reach the first electrode 91b in the interior of the through-hole 91g when performing the vapor deposition of the aluminum to form the first terminal 91f.

In the illumination device 119 of the second comparative example, the conductive unit 91h is formed integrally with the first terminal 91f. Therefore, the portions of the first terminal 91f other than the conductive unit 91h also are formed of the material (e.g., the aluminum) of the conductive unit 91h.

Therefore, it is necessary to sufficiently increase the thickness of the first terminal 91f to reduce the electrical resistance of the first terminal 91f to the desired value. It is not practical to form such a thick first terminal 91f.

In other words, an extremely large amount of time and trouble are necessary to form, for example, the first terminal 91f with a thickness of 10 μm or more by an aluminum vapor deposition film; and a practical illumination device cannot be obtained.

On the other hand, in the case where the first terminal 91f is formed with a thickness in a practical range when forming the conductive unit 91h, the thickness of the first terminal 91f is small. Therefore, the electrical resistance (the sheet resistance) of the first terminal 91f increases; in the case of an illumination device having a large surface area, the voltage drop increases; and it is difficult to realize a uniform brightness.

In other words, it is conceivable that the technology of the illumination device 119 of the second comparative example may be used in an illumination device having a relatively small surface area. However, the potential drop of the anode in the case of larger surface areas is not considered; and it may be difficult to obtain a uniform brightness in an illumination device having a large surface area with the technology of the illumination device 119 of the second comparative example.

An object of this embodiment is to solve the new problem of the brightness becoming nonuniform due to the potential drop of the anode which first occurs when the illumination device has a large surface area.

In the illumination device 110 according to this embodiment, the multiple conductive piercing layers 50 electrically connecting the anode 10 to the metal layer 40 are separate entities from the metal layer 40. Thereby, the thickness of the metal layer 40 can be increased sufficiently; and the anode 10 can be electrically connected to the metal layer 40. Thereby, the drop of the potential of the anode 10 can be suppressed; the potential of the anode 10 can be substantially constant in the plane of the anode 10; and a uniform and bright illumination device can be provided with high productivity. The nonuniform brightness caused by the nonuniform temperature also can be suppressed simultaneously.

The lengths (the lengths along the stacking direction) of the multiple conductive piercing layers 50 are about the distance between the anode 10 and the metal layer 40 (i.e., about the total of the thickness of the organic electroluminescent unit 30, the thickness of the cathode 20, and the thickness of the first insulating layer 61). Therefore, the length of the current path between the anode 10 and the metal layer 40 connected by the multiple conductive piercing layers 50 is relatively short. Therefore, the conductivity of the material of the multiple conductive piercing layers 50 may be relatively high. For example, the conductivity of the conductive piercing layer 50 may be lower than the conductivity of the metal layer 40. Thereby, the range of selection for the materials usable in the conductive piercing layer 50 increases.

In the illumination device 110, the potential drop of the anode 10 is suppressed by using a thick metal layer 40 having a high conductivity to electrically connect the metal layer 40 to the anode 10 by providing the conductive piercing layer 50 and the metal layer 40 as separate entities and by using a material having excellent patternability for the conductive piercing layer 50. Because the distance between the metal layer 40 and the anode 10 is relatively short, the requirements on the conductivity of the conductive piercing layer 50 are relaxed; and the conductive piercing layer 50 may include a material having excellent patternability suited to electrically connecting the metal layer 40 and the anode 10. According to the illumination device 110, a uniform and bright illumination device can be provided with high productivity.

Simulation results of characteristics of the illumination device 110 according to this embodiment and illumination devices of comparative examples (third and fourth comparative examples) having thin metal layers 40 will now be described.

Figure 3A:
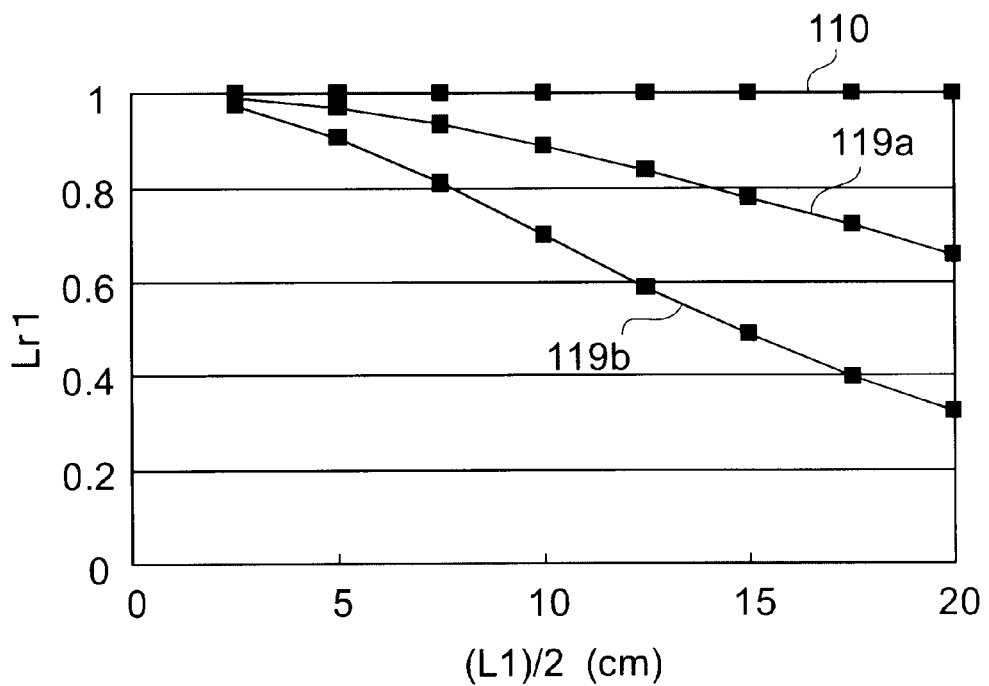
FIG. 3A and FIG. 3B are schematic views illustrating characteristics of the illumination devices.
Figure 3B:
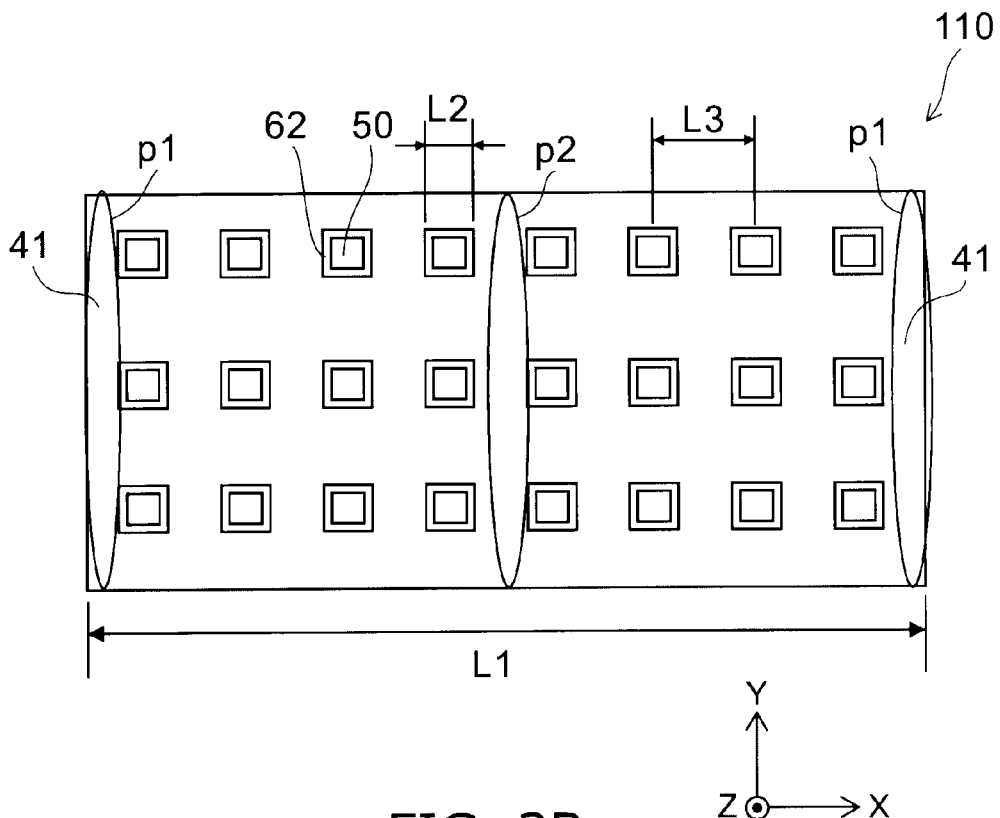

FIG. 3A and FIG. 3B are schematic views illustrating characteristics of the illumination devices.

Namely, FIG. 3B is a plan view illustrating the model of the simulation of the illumination devices. In this simulation as illustrated in FIG. 3B, the planar configuration of the illumination device 110 was a rectangle. The anode side contact 41 was taken to be the two X axis direction ends of the illumination device 110. In other words, the current was supplied along the X axis direction. Characteristics along the X axis direction were simulated.

The length of the illumination device 110 along the X axis direction (substantially the length of the light emitting portion) was taken as a length L1.

To simplify the simulation, the cross-sectional configuration (the cross-sectional configuration when cut by the X-Y plane) of the multiple conductive piercing layers 50 was taken to be a square. The width along the X axis direction of the entirety of the second insulating layer 62 enclosing one of the conductive piercing layers 50 was taken as a length L2. In other words, the length L2 is the sum of the width along the X axis direction of one of the conductive piercing layers 50, the width along the X axis direction of the second insulating layer 62 at one of the wall faces, and the thickness along the X axis direction of the second insulating layer 62 at the other wall face.

The disposition pitch of the multiple conductive piercing layers 50 along the X axis direction was taken as a length L3. Herein, the proportion of the length L2 to the length L3 (L2/L3) was taken to be 0.1. In this model, the opening ratio was $(1-(L2/L3)^2)=0.99$. The brightness in the plane of the illumination device 110 was simulated by changing the length L1, that is, by changing the length of the illumination device 110 in the X axis direction.

The brightness of the end portion p1 proximal to the anode side contact 41 in the plane of the illumination device 110 is taken as a brightness Lmax. The brightness at a central portion p2 most distal to the anode side contacts 41 was taken as a brightness Lmin. The brightness Lmin is lower than the brightness Lmax. A luminance ratio Lr1=Lmin/Lmax was used as an index of the planar distribution of the brightness.

In the illumination device 110, aluminum was used as the metal layer 40; and the thickness of the metal layer 40 was supposed to be 500 μm.

On the other hand, in the illumination device 119a of the third comparative example, the thickness of the metal layer 40 was taken to be 0.5 μm. In the illumination device 119b of the fourth comparative example, the thickness of the metal layer 40 was taken to be 0.15 μm. Other than the thicknesses of the metal layers 40 recited above, the configurations of the illumination devices 119a and 119b were taken to be the same as that of the illumination device 110.

FIG. 3A is a graph illustrating the simulation results of the illumination devices. In FIG. 3A, ½ of the length L1 is plotted on the horizontal axis; and the luminance ratio Lr1 of the brightness is plotted on the vertical axis.

In the illumination device 119a of the third comparative example in which the thickness of the metal layer 40 was 0.5 μm as illustrated in FIG. 3A, the luminance ratio Lr1 of the brightness decreases as the length L1 increases. In other words, the brightness at the central portion p2 is lower than at the end portion p1. For example, in the case where the length L1 is 20 cm (the X axis direction length of the illumination device 119a is 40 cm), the brightness at the central portion p2 drops to about 0.7 times the brightness at the end portion p1.

Such a decrease was even more pronounced for the illumination device 119b of the fourth comparative example in which the thickness of the metal layer 40 was 0.15 µm. For example, in the case where the length L1 is 20 cm, the brightness at the central portion p2 drops to about 0.3 times the brightness at the end portion p1.

Thus, in the illumination devices 119a and 119b of the third comparative example and the fourth comparative example, the brightness becomes nonuniform as the length L1 increases (as the illumination device becomes larger). This is because, in the illumination devices 119a and 119b of the third comparative example and the fourth comparative example, the resistance of the metal layer 40 was not low enough because the thickness of the metal layer 40 was thin. Therefore, the potential drop caused by the resistances of the anode 10 and the metal layer 40 occurs as the length L1 increases. As a result, the brightness at the central portion p2 decreases.

Conversely, in the illumination device 110 according to this embodiment in which the thickness of the metal layer 40 is 500 µm, the luminance ratio Lr1 of the brightness does not change at all, even for long lengths L1. This is because the thickness of the metal layer 40 is sufficiently thick and the resistance of the metal layer 40 is sufficiently low. Thereby, a low value of the resistance of the metal layer 40 can be maintained and the potential of the anode 10 does not change even in the case where the length L1 is long. As a result, a high value of the brightness at the central portion p2 can be maintained.

In the illumination device 110 according to this embodiment, the thickness of the metal layer 40 is, for example, not less than about 10 µm. Thereby, a low value of the resistance of the metal layer 40 can be maintained even in the case where the length L1 is long.

On the other hand, in the case where the metal layer 40 is formed by a method such as vapor deposition, the maximum practical thickness of the metal layer 40 is several micrometers (i.e., 1 µm to 3 µm). For example, it is difficult to practically form the metal layer 40 thicker than several micrometers using methods such as vapor deposition and sputtering. Accordingly, it is considered that the use of the metal layer 40 having the thickness not less than about 10 µm is not readily apparent within approaches of conventional art in which the metal layer and the conductive piercing layer 50 are formed simultaneously from the same material.

In the illumination device 110 according to this embodiment, the metal layer 40 and the conductive piercing layer 50 are mutually separate entities. Thereby, the thickness of the metal layer 40 can be sufficiently thick; and the metal layer 40 can be electrically connected to the anode 10 by using a material having excellent patternability as the conductive piercing layer 50. Thereby, a practical manufacturing method can be applied. Thereby, a uniform and bright illumination device can be provided with high productivity.

Further, in the illumination device 110 according to this embodiment, the planar distribution of the temperature is uniform in the illumination device because the thick metal layer 40 is used. In other words, by improving the thermal uniformity by the thick metal layer 40, the planar distribution of the temperature which occurs easily in an illumination device having a large surface area can be suppressed. Thereby, the fluctuation of the luminance caused by the temperature distribution can be suppressed. In particular, the thermal uniformity improves remarkably in the case where the thickness of the metal layer 40 is not less than about 100 µm.

Moreover, by using the thick metal layer 40, the sealability of the entire illumination device improves. According to experiments of the inventors, the reliability regarding the sealing is low in the case where an aluminum film of about 1 µm is used as the metal layer 40. However, the reliability increases remarkably when the thickness of the metal layer 40 is not less than about 100 µm. The reliability further increases remarkably when the thickness of the metal layer 40 is not less than about 500 µm. Thus, the metal layer 40 having a thickness not less than 100 µm increases the reliability of the illumination device by protecting the light emitting unit of the anode 10, the organic electroluminescent unit 30, and the cathode 20.

By using the metal layer 40, practical advantages also are provided in that damage does not easily occur and the handling is easy. In other words, the stress applied to the anode 10, the organic electroluminescent unit 30, and the cathode 20 is mitigated by setting the thickness of the metal layer 40 to be greater than the total of the thickness of the anode 10, the thickness of the organic electroluminescent unit 30, and the thickness of the cathode 20; and the strength of the illumination device against mechanical forces improves remarkably.

FIG. 4A, FIG. 4B, FIG. 4C, FIG. 5A, and FIG. 5B are schematic cross-sectional views in order of the processes, illustrating a method for manufacturing the illumination device according to the first embodiment of the invention.

Namely, these drawings are cross-sectional views corresponding to the cross section along line A1-A2 of FIG. 1B.

Figure 4A:
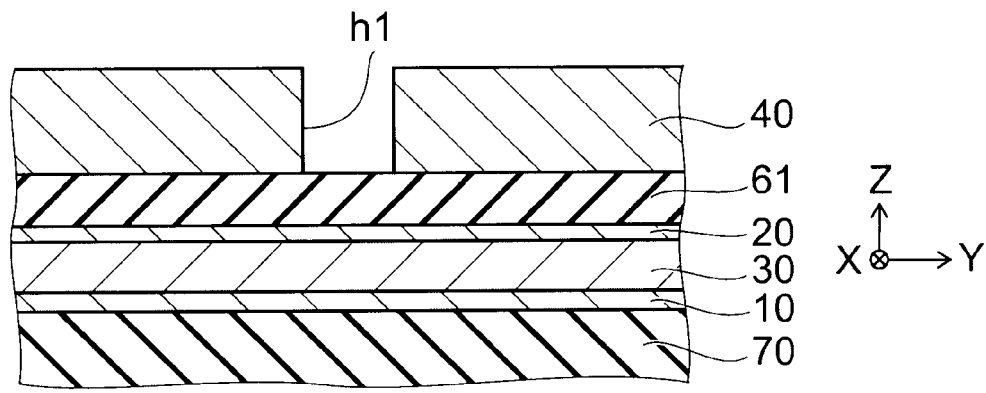
FIG. 4A to FIG. 4C are schematic cross-sectional views in order of the processes, illustrating a method for manufacturing the illumination device according to the first embodiment.

As illustrated in FIG. 4A, the anode 10, the organic electroluminescent unit 30, and the cathode 20 are stacked on a major surface of the substrate 70 made of, for example, glass, etc. Then, a thermosetting resin layer, for example, forming the first insulating layer 61 is formed on the cathode 20; and the metal layer 40 is placed thereon.

The metal layer 40 has multiple first holes h1 having diameters of, for example, about 2 mm. The pitch of the multiple first holes h1 is, for example, 20 mm. Then, the thermosetting resin layer is cured to bond the cathode 20 to the metal layer 40 by the thermosetting resin layer (the first insulating layer 61).

Figure 4B:
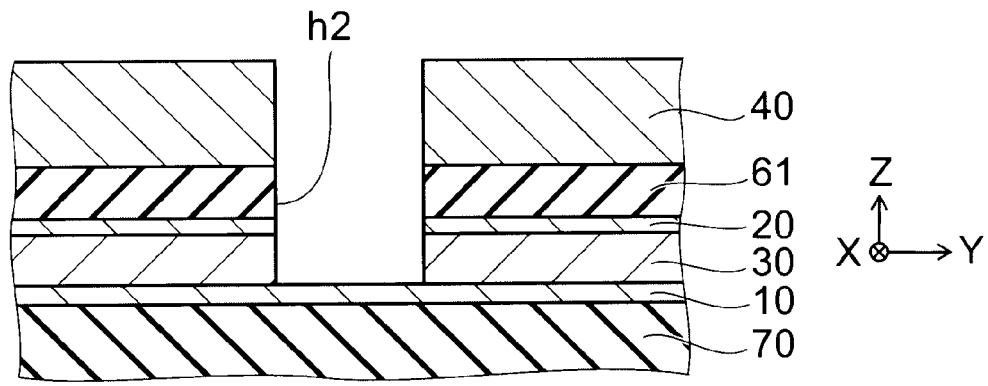

Then, as illustrated in FIG. 4B, a through-hole h2 (a second hole) is made to pierce portions of the first insulating layer 61, the cathode 20, and the organic electroluminescent unit 30 corresponding to the first hole h1 of the metal layer 40 in the Z axis direction using the metal layer 40 as a mask. Laser processing and/or sandblasting, for example, can be used to make the through-hole h2. In some cases, the patterning used to make the through-hole h2 may increase the diameter of the first hole h1 from the original diameter. In other words, the diameter of the through-hole h2 is greater than the original diameter of the first hole h1.

Figure 4C:
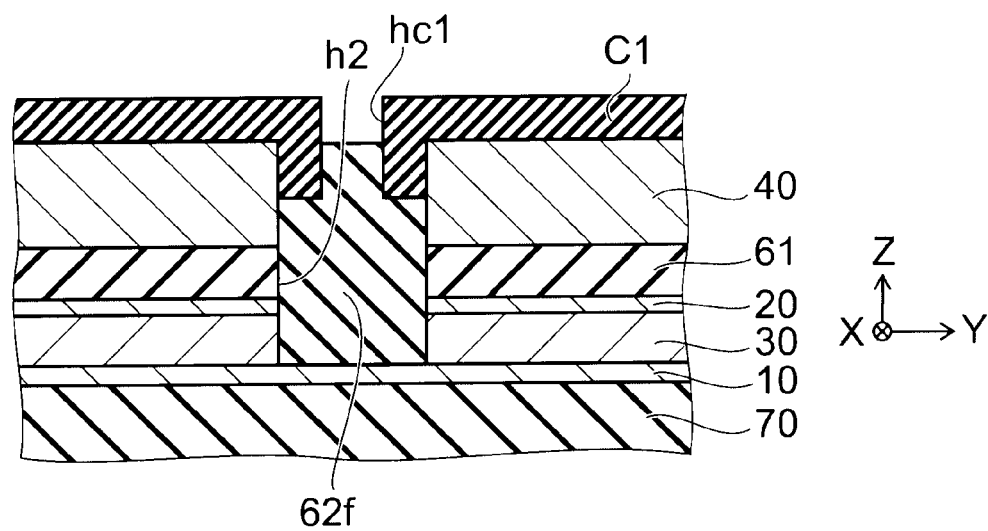

Continuing as illustrated in FIG. 4C, a plate c1 made of fluorocarbon resin and the like is placed in the first hole h1 (the upper portion of the through-hole h2) of the metal layer 40. A protrusion corresponding to the position of the first hole h1 is provided on the plate c1; and the protrusion is fitted into the first hole h1 (i.e., the through-hole h2). A hole hc1 is provided in the protrusion. Then, a photosensitive resin 62f used to form the second insulating layer 62 is filled into the interior of the through-hole h2 through the hole hc1 of the plate c1.

Figure 5A:
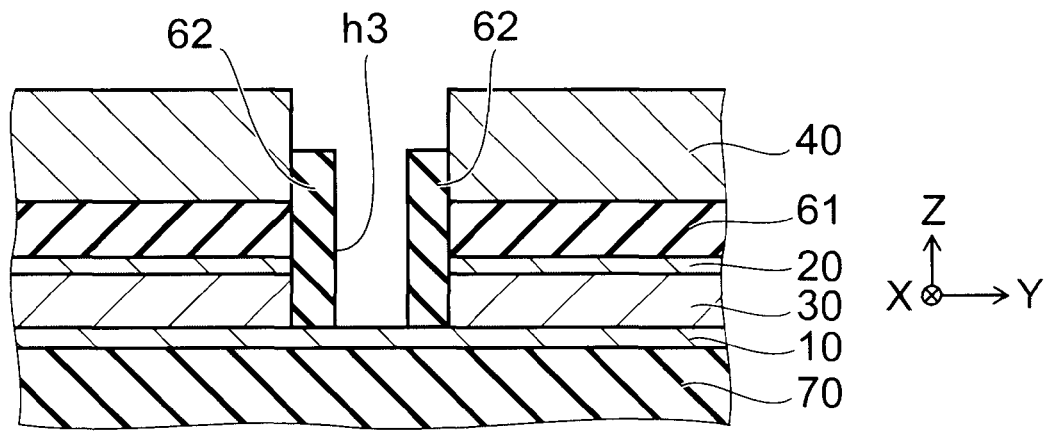
FIG. 5A and FIG. 5B are schematic cross-sectional views in order of the processes, illustrating the method for manufacturing the illumination device according to the first embodiment.

Then, after exposing as illustrated in FIG. 5A, the plate c1 is removed; developing is performed; and post-bake is performed. Thereby, the second insulating layer 62 is formed of the photosensitive resin 62f on the side face of the through-hole h2. In other words, the third hole h3 is made in the interior of the second insulating layer 62 in the interior of the through-hole h2.

Instead of the photosensitive resin 62f in the process of FIG. 4C, for example, a thermosetting resin may be filled through the hole hc1 of the plate c1 into the interior of the through-hole h2. In such a case, the second insulating layer 62 may be formed of the thermosetting resin on the side face of the through-hole h2 by a method such as, for example, sandblasting.

Figure 5B:
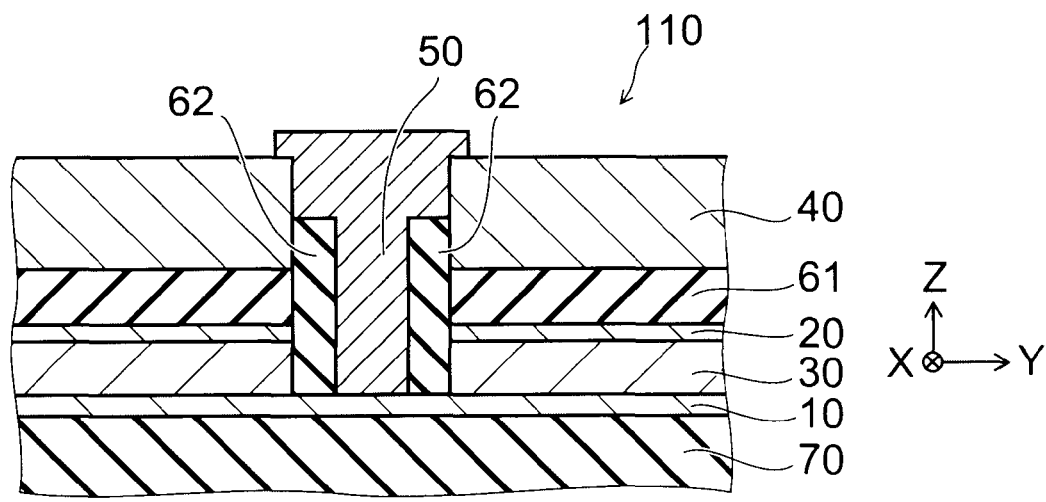

Then, as illustrated in FIG. 5B, a conductive bonding agent is filled into the remaining space (the third hole h3) of the through-hole h2 and cured to form the conductive piercing layer 50.

Thereby, the illumination device 110 illustrated in FIG. 1A and FIG. 1B can be formed.

In the manufacturing method recited above, positional alignment can be performed simply because the metal layer 40 (the metal plate) having the first holes h1 is used as the mask when making the through-holes h2 and because the plate c1 having the holes hc1 in the protrusions fitted into the first holes h1 is used as the mask when forming the second insulating layer 62 on the side face of the through-hole h2. Therefore, a uniform and bright illumination device can be manufactured efficiently and with good manufacturability.

Processing methods such as wet etching and dry etching may damage the element when processing a light emitting element using the organic electroluminescent unit 30 and therefore are not suited thereto. Conversely, according to the manufacturing method recited above, such damage can be suppressed.

Second Embodiment

Figure 6:
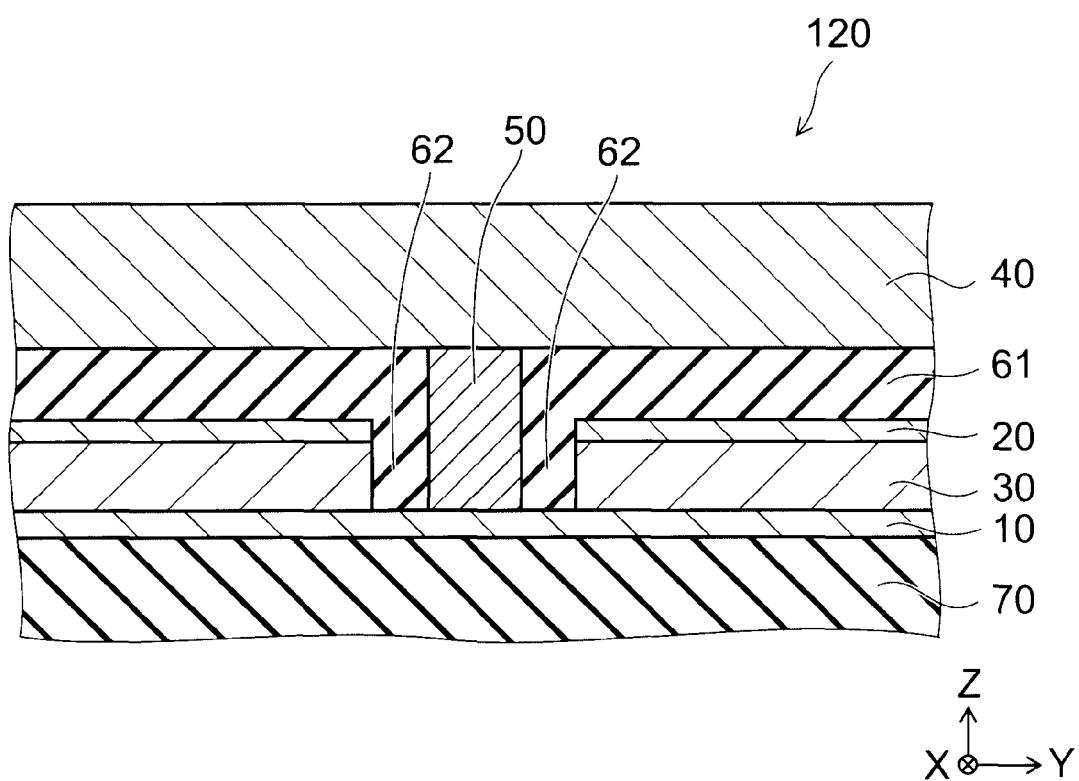
FIG. 6 is a schematic cross-sectional view illustrating the configuration of an illumination device according to a second embodiment.

FIG. 6 is a schematic cross-sectional view illustrating the configuration of an illumination device according to a second embodiment of the invention.

Namely, FIG. 6 is a cross-sectional view corresponding to the cross section along line A1-A2 of FIG. 1B.

As illustrated in FIG. 6, the illumination device 120 according to this embodiment also includes the anode 10, the metal layer 40, the cathode 20, the organic electroluminescent unit 30, the first insulating layer 61, the multiple conductive piercing layers 50, and the second insulating layer 62 described in regard to the first embodiment. However, in the illumination device 120, the first insulating layer 61 and the second insulating layer 62 are formed integrally.

According to the illumination device 120 as well, similarly to the illumination device 110, a uniform and bright illumination device can be provided with high productivity.

One example of a method for manufacturing the illumination device 120 will now be described.

Figure 7A:
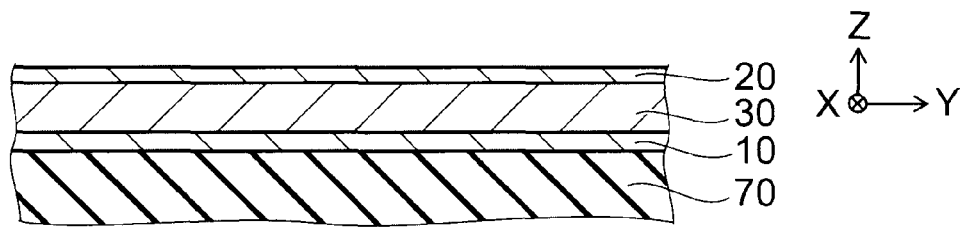
FIG. 7A to FIG. 7C are schematic cross-sectional views in order of the processes, illustrating a method for manufacturing the illumination device according to the second embodiment.
Figure 7B:
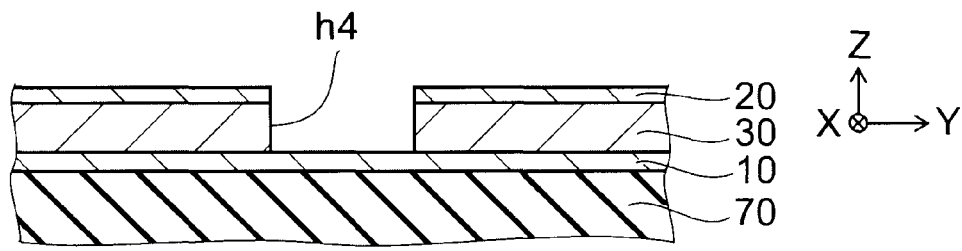
Figure 7C:
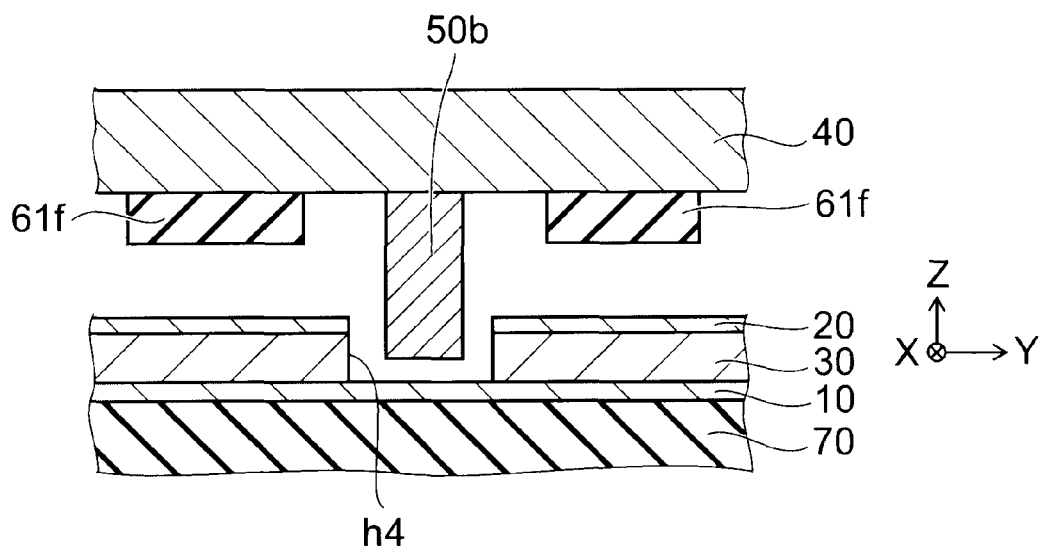

FIG. 7A, FIG. 7B, and FIG. 7C are schematic cross-sectional views in order of the processes, illustrating the method for manufacturing the illumination device according to the second embodiment of the invention.

In other words, these drawings are cross-sectional views corresponding to the cross section along line A1-A2 of FIG. 1B.

As illustrated in FIG. 7A, the anode 10, the organic electroluminescent unit 30, and the cathode 20 are formed by stacking on a major surface of the substrate 70 made of, for example, glass, etc.

Then, as illustrated in FIG. 7B, the through-hole h4 (a fourth hole) is made to pierce the organic electroluminescent unit 30 and the cathode 20 in the thickness direction. Laser processing, for example, may be used to make the through-hole h4.

Continuing as illustrated in FIG. 7C, the metal layer 40 (the metal plate) is disposed above the cathode 20. A conductive bump 50b and, for example, a thermosetting resin 61f are provided on the face of the metal layer 40 on the side opposing the cathode 20. The thermosetting resin 61f is provided in the regions where the bump 50b is not provided. At this time, the bump 50b opposes the anode 10; and the thermosetting resin 61f opposes the cathode 20. The metal layer 40 is disposed above the cathode 20 in this state. Then, the metal layer 40 is pressed toward the substrate 70 and compression bonded while heating; the bump 50b is connected to the anode 10; and the cathode 20 is bonded to the metal layer 40 by the thermosetting resin 61f.

At this time, by setting the thickness (the height) of the bump 50b thicker (higher) than the thickness of the thermosetting resin 61f, the bump 50b contacts the anode 10 prior to the thermosetting resin 61f contacting the cathode 20. Then, after the bump 50b contacts the anode 10 and is bonded thereto, the thermosetting resin 61f contacts the cathode 20 and is heated; and the heated thermosetting resin 61f has a higher fluidic property and flows into the through-hole h4. Then, the thermosetting resin 61f is cured; and the thermosetting resin 61f at the portion between the cathode 20 and the metal layer 40 forms the first insulating layer 61. The thermosetting resin 61f at the portions between the bump 50b and the cathode 20 and between the bump 50b and the organic electroluminescent unit 30 forms the second insulating layer 62. The bump 50b forms the conductive piercing layer 50.

Thus, the illumination device 120 illustrated in FIG. 6 is manufactured.

The manufacturing method recited above has the advantage that the processes are simpler than those of the manufacturing method described in regard to the first embodiment.

Third Embodiment

A manufacturing method of an illumination device according to this embodiment is a method for manufacturing the illumination device 110 according to the first embodiment.

Figure 8:
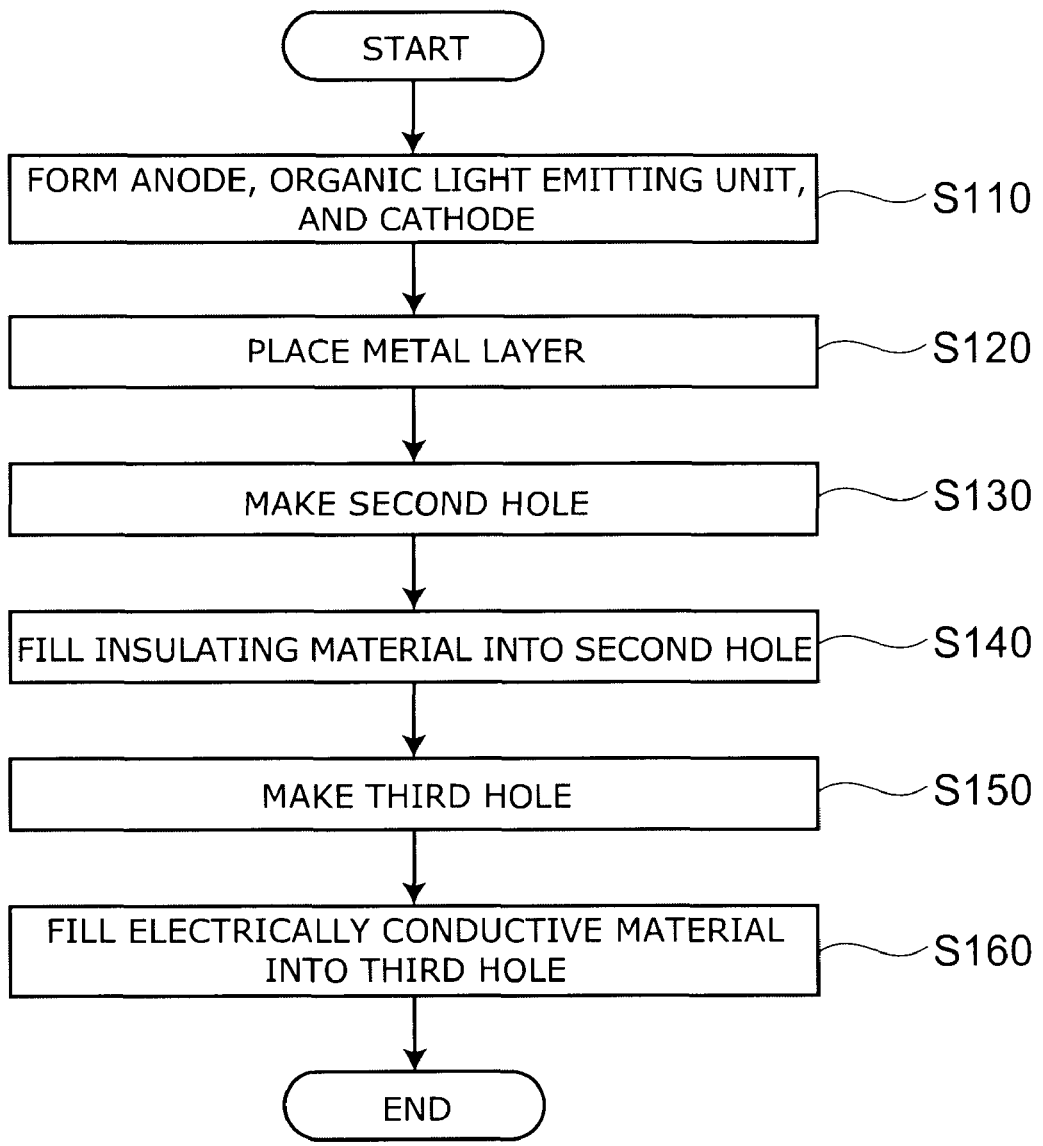
FIG. 8 is a flowchart illustrating a method for manufacturing a illumination device according to a third embodiment.

FIG. 8 is a flowchart illustrating the method for manufacturing the illumination device according to the third embodiment of the invention.

In the manufacturing method according to this embodiment as illustrated in FIG. 8, the anode 10, the organic electroluminescent unit 30, and the cathode 20 are formed on the substrate 70 (e.g., a glass substrate) in the order of the anode 10, the organic electroluminescent unit 30, and the cathode 20 (step S110).

Then, the metal layer 40 (e.g., the metal plate) having the multiple first holes h1 is placed on the cathode 20 with the first insulating layer 61 interposed therebetween (step S120). In other words, the processing described in regard to FIG. 4A, for example, is implemented.

Continuing, the multiple second holes (the through-holes h2) are made to pierce the organic electroluminescent unit 30, the cathode 20, and the first insulating layer 61 using the multiple first holes h1 as a mask (step S130). In other words, the processing described in regard to FIG. 4B is implemented.

Then, an insulating material (e.g., the photosensitive resin 62f) is filled into the multiple second holes (the through-holes h2) (step S140). In other words, the processing described in regard to FIG. 4C is implemented.

Continuing, the third hole h3 is made in the insulating material recited above to reach the anode 10 (step S150). In other words, the processing described in regard to FIG. 5A is implemented.

Then, a conductive material is filled into the third hole h3 to electrically connect the metal layer 40 and the anode 10 (step S160). In other words, the processing described in regard to FIG. 5B is implemented. According to the method for manufacturing the illumination device according to this embodiment, a uniform and bright illumination device can be manufactured efficiently and with good manufacturability.

Fourth Embodiment

A method for manufacturing an illumination device according to this embodiment is a method for manufacturing the illumination device 120 according to the second embodiment.

Figure 9:
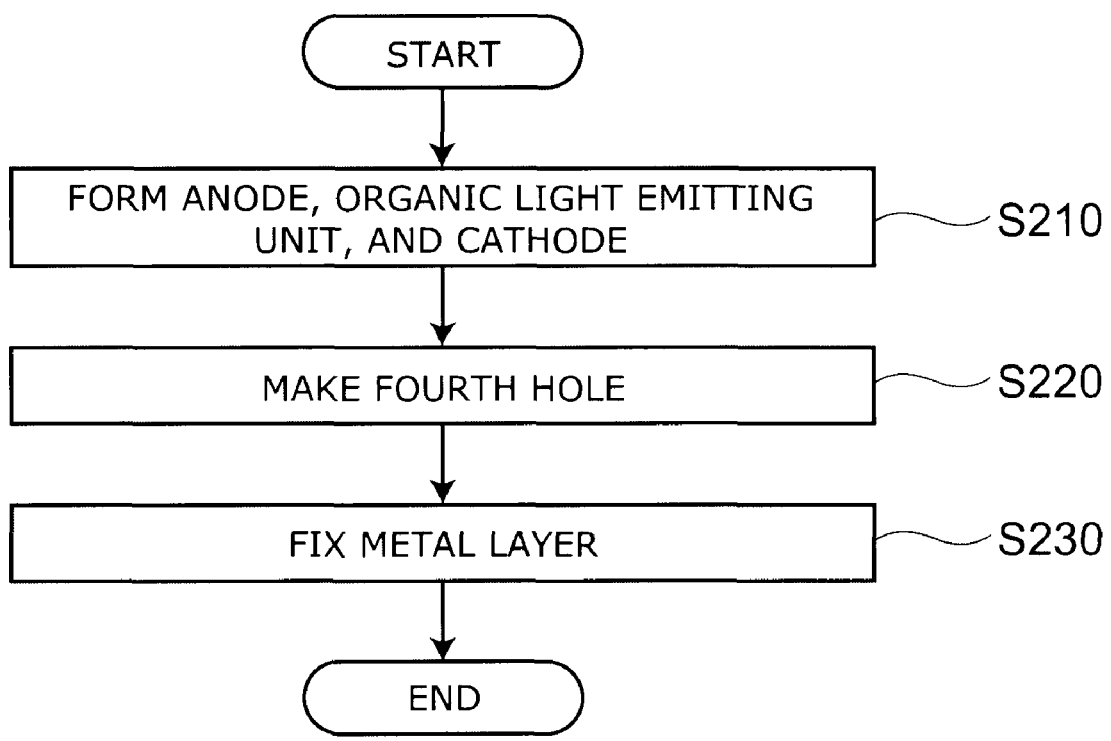
FIG. 9 is a flowchart illustrating a method for manufacturing an illumination device according to a fourth embodiment.

FIG. 9 is a flowchart illustrating the method for manufacturing the illumination device according to the fourth embodiment of the invention.

In the manufacturing method according to this embodiment as illustrated in FIG. 9, the anode 10, the organic electroluminescent unit 30, and the cathode 20 are formed on the substrate 70 (e.g., a glass substrate) in the order of the anode 10, the organic electroluminescent unit 30, and the cathode 20 (step S210). In other words, the processing described in regard to FIG. 7A is implemented.

Then, multiple fourth holes (the through-holes h4) are made to pierce the organic electroluminescent unit 30 and the cathode 20 (step S220). In other words, the processing described in regard to FIG. 7B is implemented.

Continuing, multiple conductive protrusions (e.g., the bumps 50b) of the metal layer 40 having the multiple protrusions (the bumps 50b) and an insulating layer (e.g., the thermosetting resin 61f) formed on the major surface thereof are fitted into the fourth holes while the insulating layer recited above opposes the cathode 20; and the metal layer 40 is fixed to the cathode 20 via the insulating layer in a state in which the anode 10, the multiple protrusions (the bumps 50b), and the metal layer 40 are electrically connected (step S230). In other words, the processing described in regard to FIG. 7C is implemented.

According to the method for manufacturing the illumination device according to this embodiment as well, a uniform and bright illumination device can be manufactured efficiently and with good manufacturability.

Hereinabove, exemplary embodiments of the invention are described with reference to specific examples. However, the invention is not limited to these specific examples. For example, one skilled in the art may similarly practice the invention by appropriate selections from known art, including various modifications made by one skilled in the art in regard to configurations, sizes, material qualities, arrangements, and the like of specific configurations of components included in illumination devices such as anodes, cathodes, organic electroluminescent units, organic electroluminescent layers, metal layers, insulating layers, conductive piercing layers, substrates, and the like. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all illumination devices and methods for manufacturing illumination devices practicable by an appropriate design modification by one skilled in the art based on the illumination devices and the methods for manufacturing illumination devices described above as embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. An illumination device, comprising:
   an anode;
   a metal layer having an electrical resistance lower than an electrical resistance of the anode;
   a cathode provided between the anode and the metal layer;
   an organic electroluminescent unit provided between the anode and the cathode;
   a first insulating layer provided between the cathode and the metal layer;
   a plurality of conductive piercing layers piercing the organic electroluminescent unit, the cathode, and the first insulating layer along a direction from the anode toward the metal layer to electrically connect the anode to the metal layer, the plurality of conductive piercing layers being separate entities from the metal layer; and
   a second insulating layer provided between the organic electroluminescent unit and each of the plurality of conductive piercing layers and between the cathode and each of the plurality of conductive piercing layers.

2. The device according to claim 1, wherein a thickness of the metal layer is not less than 10 micrometers.

3. The device according to claim 1, wherein a thickness of the metal layer is not less than 100 micrometers.

4. The device according to claim 1, wherein a thickness of the metal layer is greater than the total of a thickness of the anode, a thickness of the organic electroluminescent unit, and a thickness of the cathode.

5. The device according to claim 1, wherein the anode transmits light emitted by the organic electroluminescent unit.

6. The device according to claim 1, wherein the cathode includes aluminum.

7. The device according to claim 1, wherein the second insulating layer is further provided between the first insulating layer and the plurality of conductive piercing layers.

8. The device according to claim 1, wherein the second insulating layer includes a photosensitive resin.

9. The device according to claim 1, wherein each of the plurality of conductive piercing layers includes a conductive resin.

10. The device according to claim 1, wherein a material used in the plurality of conductive piercing layers has better patternability than a material used in the metal layer.

11. The device according to claim 1, wherein a conductivity of the plurality of conductive piercing layers is lower than a conductivity of the metal layer.

12. The device according to claim 1, wherein the plurality of conductive piercing layers are made of a material different form a material of the metal layer.

* * * * *